United States Patent [19]
Steijer et al.

[11] Patent Number: 6,072,229
[45] Date of Patent: *Jun. 6, 2000

[54] LEADFRAME FOR AN ENCAPSULATED OPTOCOMPONENT

[75] Inventors: Odd Steijer, Bromma; Paul Eriksen, Tyresö, both of Sweden

[73] Assignee: Telefonaktiebolaget LM Ericsson, Stockholm, Sweden

[ * ] Notice: This patent issued on a continued prosecution application filed under 37 CFR 1.53(d), and is subject to the twenty year patent term provisions of 35 U.S.C. 154(a)(2).

[21] Appl. No.: 08/817,421
[22] PCT Filed: Oct. 19, 1995
[86] PCT No.: PCT/SE95/01234
  § 371 Date: Jun. 30, 1997
  § 102(e) Date: Jun. 30, 1997
[87] PCT Pub. No.: WO96/13065
  PCT Pub. Date: May 2, 1996

[30] Foreign Application Priority Data

Oct. 19, 1994 [SE] Sweden ................... 9403575

[51] Int. Cl.$^7$ ................................. H01L 23/495
[52] U.S. Cl. .................... 257/666; 257/674; 257/676; 257/669
[58] Field of Search .................... 257/99, 666, 669, 257/676, 670, 674, 672, 677; 438/106, 123, 109

[56] References Cited

U.S. PATENT DOCUMENTS

| | | |
|---|---|---|
| 3,914,786 | 10/1975 | Grossi ........................ 257/98 |
| 4,803,540 | 2/1989 | Mojer et al. . |
| 4,870,474 | 9/1989 | Karashima ................... 257/669 |
| 5,150,193 | 9/1992 | Yasuhara et al. ............. 257/669 |

FOREIGN PATENT DOCUMENTS

| | | |
|---|---|---|
| 0 446410 A2 | 9/1990 | European Pat. Off. . |
| 0 443508 A1 | 2/1991 | European Pat. Off. . |
| 0 443634 A1 | 2/1991 | European Pat. Off. . |
| 0 552419 A1 | 10/1992 | European Pat. Off. . |
| 2-94657 | 4/1990 | Japan ........................... 257/676 |

*Primary Examiner*—O. Chaudhuri
*Assistant Examiner*—Phat X. Cao
*Attorney, Agent, or Firm*—Burns, Doane, Swecker & Mathis, L.L.P.

[57] ABSTRACT

In encapsulating an optocomponent a leadframe (51) is used for the electrical connection of the component, the leadframe having a flag (53), to which the main body of the optocomponent is attached. The flag (53) is located asymmetrically at an outer edge of the leadframe and is, in the encapsulating operation, placed close to a sidewall in a mould cavity in a mould. Thereby an optical interface of standard type can be obtained in the wall of the capsule. Further, the flag (53) is flexibly attached, by means of zigzag-shaped bridges (67), to other portions of the leadframe so that the flag and thus the optocomponent will have a possibility to be resiliently and flexibly displaced a little at the positioning thereof in the mould cavity in the mould in relation to the other portions of the leadframe, in particular to its outer frame portions (61) and bridge portions (59). By designing the zigzag-shaped bridges (67) with a suitably adapted width and thickness a controlled elastic restoring force acting on the flag (53) can be obtained and thus on the optocomponent, so that it can be pressed and firmly retained in engagement with positioning means for the optocomponent.

21 Claims, 3 Drawing Sheets

LEADFRAME FOR AN ENCAPSULATED OPTOCOMPONENT

This application is related to simultaneously filed applications "Injection of encapsulating material on an optocomponent" and "Optocomponent capsule having an optical interface".

The present invention relates to a leadframe intended and adapted for encapsulation of optocomponents with a plastics material and a method of encapsulating optocomponents with a plastics material, during simultaneous obtainment of optical interfaces in the capsule wall.

BACKGROUND

In the earlier patent application SE 9400907-3, filed Mar. 18 1994, a method of encapsulating optocomponents by means of transfer moulding and of obtaining at the same time an optical interface in the wall of the capsule is described. This method is developed from the conventional encapsulating method for microelectronic circuits, where an electrically conducting leadframe is used for establishing an electric connection to microelectronic circuit chips. The leadframe usually consists of a punched or etched metal piece, e.g. of a thin copper or aluminium sheet. The leadframe comprises a special, suitably adapted portion termed "flag", onto which a microelectronic circuit is mounted before being moulded into the encapsulating material. Before the moulding embedment, the microcircuit chip is also electrically connected by friction welding, "bonding", by means of "bonding" wires to fingers and thereby also to legs of the leadframe.

Moreover, in encapsulation of optocomponents an optical interface is to be formed in the wall of the capsule having a high accuracy as to the position of the component in relation to another optocomponent or an optical connector device, to which the encapsulated component is to be connected. The required mechanical accuracy is achieved by mounting one or more optocomponents on a common carrier or substrate in the shape of a plate, which thereafter is attached to the flag. Finally the carrier is positioned in relation to the external geometry. For an optical interface, which is compatible with an optical multi-fiber contact of MT-device type, this is achieved by means of V-grooves on the carrier plate, in which guide pins extending through the mould cavity fit. These guide pins are pulled out after the encapsulation and then leave circular cylindrical holes in the encapsulation material. Into these holes, loose cylindrical guide pins are then inserted, at connection of the encapsulated optocomponent to a component having a similar interface.

The published European patent application EP-A1 0 452 634 discloses a leadframe intended for encapsulation of optical modules with a plastics material having several waveguides. In FIGS. 4–7 leadframes having flags intended for electronic circuit elements are shown, where portions of bridges between flag portions and a frame part extending at the edge are zigzag shaped in order to accommodate mechanical strains, which are caused by the plastics encapsulation. The zigzag shaped portions are located outside of the area the leadframe, which is contained inside the encapsulated module and which is shown by the dashed line P.

The published European patent application EP-A1 0 552 419 describes apparatus and a method for manufacturing optical modules by plastics encapsulation of amongst others optocomponents connected to a lead frame. In FIG. 6c it is shown how an optocomponent, using a wire W, is influenced by a pressing force for the purpose of obtaining an exact positioning.

Leadframes for semiconductor capsules are e.g. disclosed in U.S. Pat. No. 4,870,474 and 5,150,193 and in the published European patent application EP-A1 0 443 508. Optical components having leadframes are also discribed in U.S. Pat. No. 3,914,786 and the published European patent application EP-A2 0 446 410.

SUMMARY

It is an object of the invention to provide a lead frame for mounting a carrier having one or more optocomponents next to a side wall of a capsule.

It is a further object of the invention to provide a leadframe for electrical connection of a carrier having one or more optocomponents, which leadframe allows that the carrier can be oriented for an accurate positioning during the moulding embedment of the carrier.

It is a further object of the invention to provide an encapsulated optical component and a manufacturing process thereof, in which a carrier attached to a leadframe becomes accurately positioned during the encapsulation process.

These and other advantageous objects are achieved by the invention and appear from description hereinafter, the scope of the invention being defined in and the characteristics thereof being set out in the appended claims.

A leadframe is designed, so that:

I) a flag, to which the very main portion of the optocomponent is attached, is placed asymmetrically next to the mould cavity wall, so that an optical interface is obtained in the capsule wall, II) the flag is flexibly attached in the leadframe for the purposes of:

a) obtaining an adjustment possibility of the flag in relation to the rest of the leadframe, b) obtaining an adjusted pressure force on the flag, and thereby on the optocomponent, in relation the mould cavity wall in order to minimize after-treatment of the optical interface, c) obtaining an adjusted pressure force on the flag, and thereby on the optocomponent, so that an exact positioning of the optocomponent can be obtained. Bridges by means of which the flag is attached to the leadframe have for this purpose a zigzag shape.

Hence, a leadframe having a flag, to which very main part of the optocomponent is attached, is thus used for the electrical connection in encapsulation of an optocomponent. The leadframe also comprises connection portions for electrical connection to both the optocomponent and to the exterior, to adjacent electrical circuits. The flag is asymmetrically placed at the outer edge of the leadframe, centrally on this outer edge, and will then be placed next to a wall in a mould cavity in a mould during the encapsulating process. Hereby, an optical interface of standard type having guide pins can be obtained in the capsule wall. The flag is attached somewhat movably by means of zigzag shaped bridges to the other portions of the leadframe in order to enable the flag and hereby the optocomponent to be moved somewhat in relation to the rest of the leadframe. For a suitable width and shape of the zigzag shaped bridge portions an adjusted elastic return force on the flag and thereby an the optocomponent is also obtained, so that it can be pressed against and firmly be retained against positioning means, in the shape of for instance guide pins, which shall be located in guide grooves of the optocomponent during the moulding operation.

A leadframe of an electrically conducting material for connection of electrical connections on an optocomponent generally comprises a flag in the shape of a usually rectangular field for attachment to a main part of the optocomponent, further it comprises connection fingers, the ends of which are intended to be electrically connected, in particular through bonding, to terminals on the optocomponent, and support parts, which extend between the connection fingers and connect to these at areas at a distance from the ends of the connection fingers, which are intended for connection to the component. Further, there are support bridges, which connect the flag to the support parts and which are located in such a place, that the support bridges connect to the support parts at an end thereof. Moreover, the flag shall be located at a side of the frame in order that an optocomponent attached to the flag and an edge thereof shall become positioned at the outer edge of a capsule containing the component.

The support bridges have advantageously the shape of flat bands, which thus are located in one and the same plane and are zigzag shaped, i.e. each of the bands is alternatingly bent to one side and another side, as seen when moving from the connection area of the bridge at a support part to the connection area at the flag, in order to allow an elastic retainment of the flag and in order to give this some movement possibility. The ends of the connection fingers, which are intended for connection to the component, can be placed next to an essentially straight side or a edge of the flag, preferably an edge, which is opposite to the edge of the flag, which during positioning of an optocomponent at an outer side of a capsule, is located next to this outer side. The support parts then advantageously extend essentially perpendicularly to this essentially straight edge of the flag.

An encapsulated optoelectric component obtained together with the leadframe then generally comprises an optocomponent carrier having areas arranged thereon for electrical connection, an optical interface at one side or edge thereof having inlets/outlets for light signals or having waveguide ends, further leadframe parts, which have been obtained from the leadframe for electrical connection of areas on the optocomponent carrier and which comprise outer connection tongues, and moreover an encapsulating enclosure enclosing the main part of the optocomponent carrier and of the leadframe. The leadframe parts also comprise a flag, which is attached to a main part of the optocomponent and which is located at a side or a surface of the component or of its main part, and further the leadframe parts comprise terminal parts, which are electrically connected through wires to terminals on the optocomponent carrier. The leadframe parts in the encapsulated component will according to the above advantageously comprise zigzag shaped parts, that extend from the flag.

In manufacturing such an encapsulated optocomponent the following steps are generally carried out. The optocomponent is first manufactured having guide grooves for guide pins on a first, top surface. Then, it is attached to a flag in a leadframe, guide pins are placed in an opened mould cavity in a mould and the leadframe having an attached optocomponent is placed in the opened mould cavity of the mould, so that the guide pins engage in the guide grooves, where the two latter steps can change positions with each other. Thereupon the mould cavity of the mould is closed and then the arrangement of the leadframe with the optocomponent in relation to guide pins is such that the guide pins and the optocomponent hereby become correctly positioned in relation to each other and the leadframe is retained in the mould cavity, whereby an elastic force originating from the leadframe is applied to the optocomponent, so that this with its guide grooves is pressed onto the guide pins and the optocomponent is accurately guided into its intended position. Finally, the encapsulation material is introduced into the closed mould cavity and is allowed to solidify, the mould cavity is opened, the guide pins can be extracted and the moulded body can be removed from the mould cavity. The elastic force from the leadframe, acting on the flag is suitably obtained, by the fact that the flag is attached to the other part of the leadframe through bridge parts having such a geometric shape, that they can be elastically or resiliently prolonged.

BRIEF DESCRIPTION OF THE DRAWINGS

The invention will now be described by way of a non-limiting embodiment with reference to the accompanying drawings, in which.

DETAILED DESCRIPTION

Figure 1:
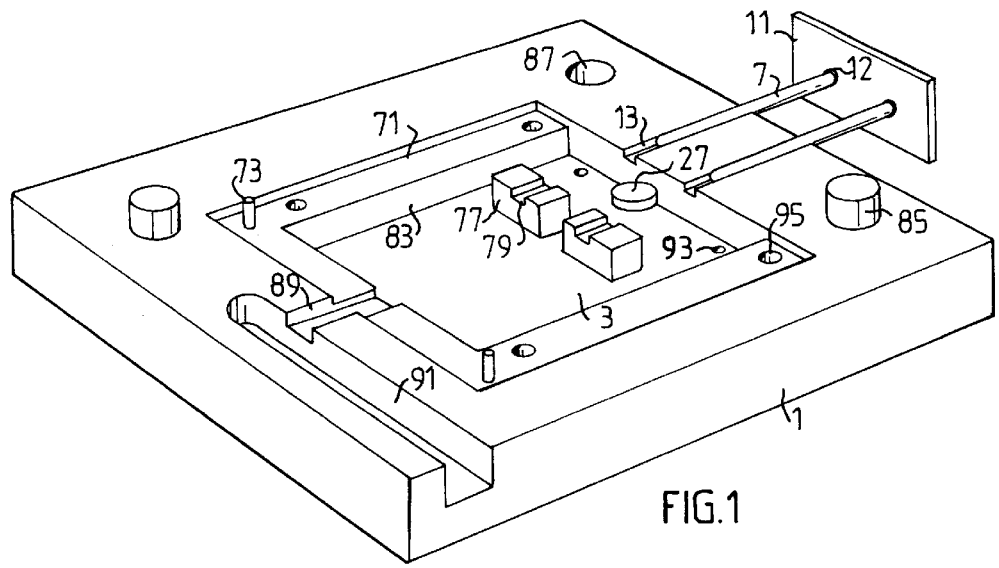
FIG. 1 is a perspective view of a lower mould for manufacturing an encapsulated optocomponent.
Figure 5:
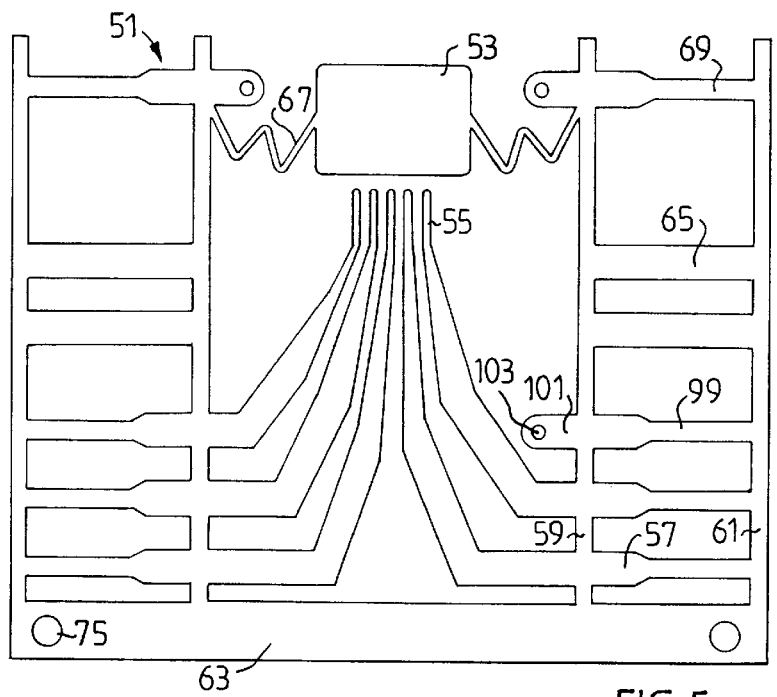
FIG. 5 is a view from above of a leadframe for electric connection of an optocomponent.

In FIG. 1 a lower mould half 1 is shown having a mould cavity 3. The lower mould 1 has generally the shape of a rectangular block having side surfaces and a bottom surface, where the mould cavity 3 also has a rectangular shape and is formed in one of the large surfaces, the top surface of the lower mould 1, so that the edges and the various surfaces of the mould 1 and the mould cavity 3 are all essentially parallel to or perpendicular to each other. The mould cavity 3 has steps at three of its side surfaces in order to also be able to receive a leadframe 51 of the type, which is shown in FIG. 5 and also in FIG. 3, where the lower mould half 1 is seen from above with a leadframe 51 and an optocomponent plate 5 placed therein.

The leadframe 51 has a generally flat shape and is manufactured of a thin electrically conducting plate such as copper plate or aluminum plate and can be cut out by punching or etching or similar methods. It comprises a flag 53 in the shape of a rectangular area which can be a whole surface or in certain cases, not shown, can be equipped with a centrally located hole. To the flag 53 the optocomponent plate 5 is applied, e.g. is cemented by means of a heat conducting adhesive. If the flag has a hole, this can be used for, for instance, thermal dissipation from the component plate. The leadframe 51 has a generally rectangular outer contour comprising outer edges, where the flag is centrally located at one of the outer edges, the front edge. Connection fingers 55 extend from that edge of the flag 53, which is directed towards the centre of the leadframe and away from the mentioned front edge of the leadframe 51, and up to contact legs 57.

The contact legs 57 are in the embodiment shown placed perpendicularly to the two edges of the outer contour of the leadframe 51, which have the outer edge located between them, where the flag 53 is placed. The legs 51 are mutually connected by inner bridges 59, which extend in parallel to and at a distance from said opposite edges, and by outer bridges or bridge parts 61 extending along these edges. At the fourth edge of the leadframe 51 there is a stronger, wider bridge part 63, from which the smaller inner and outer bridges 59 and 61 extend. In the areas where there are no contact legs 57, the pair of one inner and one outer bridge 59 and 61 at each edge is mutually connected by cross bridges 65 in order to keep these bridge parts attached to each other and for a simpler handling of the leadframe.

Hence, in the shown embodiment, the contact legs 57 are placed at the rear portion of the leadframe 51, which is located in the vicinity of the rear outer edge, which is opposite to the front edge, at which the flag 53 is arranged, i.e. they are located at a rather large distance from the flag. Further, the flag 53 is connected to the inner bridges 59 at this front edge, along which no bridge parts extend, via thinner or slimmer zigzag shaped bridge parts 67, which extend from two opposite edges of the flag 53. These narrow bridge parts 67, located in one and the same plane have, as has been mentioned, a zigzag design or generally having curves or bends to alternatingly one and another direction. Further, they are attached close to an end portion of the inner bridge portions 59, where also a cross bar 69, which can have the same configuration as the outer portion of a contact leg 57, connects the inner and outer bridge portions 59, 61.

In the lower mould part 1, see FIG. 1, the leadframe rests on shoulders 71 at three of the edges of the mould cavity 3. The width of these shoulders 71 is adjusted, so that the shoulder ends next to the inner edge of the inner bridges 59 of the leadframe 51 and the inner edge of the stronger rear bridge portion 63 of the leadframe, in the respective cases. The height of the shoulders 71 is adjusted, so that the distance between the top surfaces of the shoulders and the lower mould half 1 is approximately equal to the thickness of the electrically conducting leadframe 51. Fixed guide pins 73 protrude from the shoulder 71 upwards to be placed in holes 75 in the wider rear bridge portion of the leadframe 51, see FIG. 2, in order to keep the leadframe in the correct position in the mould cavity 3.

For positioning a component carrier there are guide pins 7 having essentially the shape of straight circular cylinders which have rounded off tips at their one end. At their other end, they are retained at a plate 11, which, in a moulding operation is pressed against a side surface of the whole compressed mould. The guide pins 7 can at their end at the plate 11 be equipped with heads, not shown, in the same manner as conventional bolts or nails, and with their cylindrical portion pass through bores 12 in the plate 11, which have a section, that is a little wider than the diameter of the portion of the guide pins 7 which has a uniform thickness, to allow some movement of the guide pins.

Figure 3:
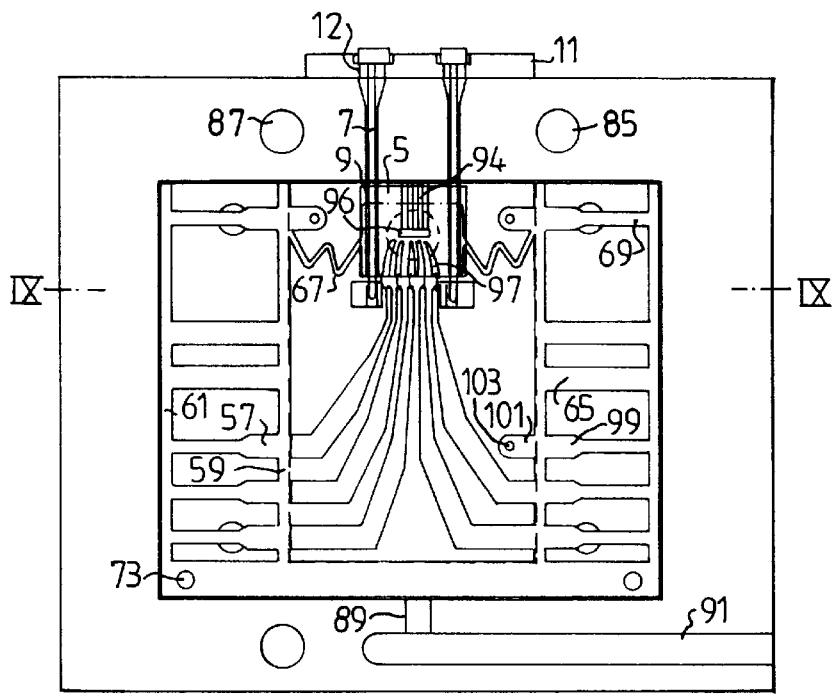
FIG. 3 is a view from above of the lower mould according to FIG. 1 having a leadframe and an optocomponent placed therein.

The optical component 5, see FIG. 3, which can be hybrid type having a substrate plate, e.g. a silicon wafer, and components mounted thereon, not shown, has the shape of a rectangular plate, which next to and parallel to two of its opposite edges has guide grooves 9, which e.g. can have a triangular shape, as seen in a cross-section, such as a section having the shape of an isosceles triangle, which extends from one of the large side surfaces of the component plate 5 and has a top angle of e.g. 45°–60°. The guide grooves are intended for positioning the optical component plate 5 and for this, they are to be placed in engagement with the guide pins 7, so that these will be well pressed into the guide grooves 9.

For the guide pins 7 there are grooves 13 on the edge surface of the top marginal surface of the lower mould half 1, which extend from the outer side surface of this mould half and pass into the mould cavity 3. On the bottom of the mould cavity 3 in the lower mould half 3, there are supports 77, which protrude upwards and have guide grooves 79, which are located in the extension of the grooves 13 on the marginal surface of the mould half and form inner supports for the guide pins 7, when these are inserted into the mould. The supports 77 are arranged adjacent to the inner edge of an optical component plate 5, compare FIG. 3, when this is placed inside the mould cavity 3 next to one of its sides, so that the guide pins 7 extends freely over the whole component plate 5 between the supports in the grooves 13 of the lower mould part 1 and the guide grooves 79 on the supports 77 and only over short distances therebetween and in addition thereto.

Figure 2:
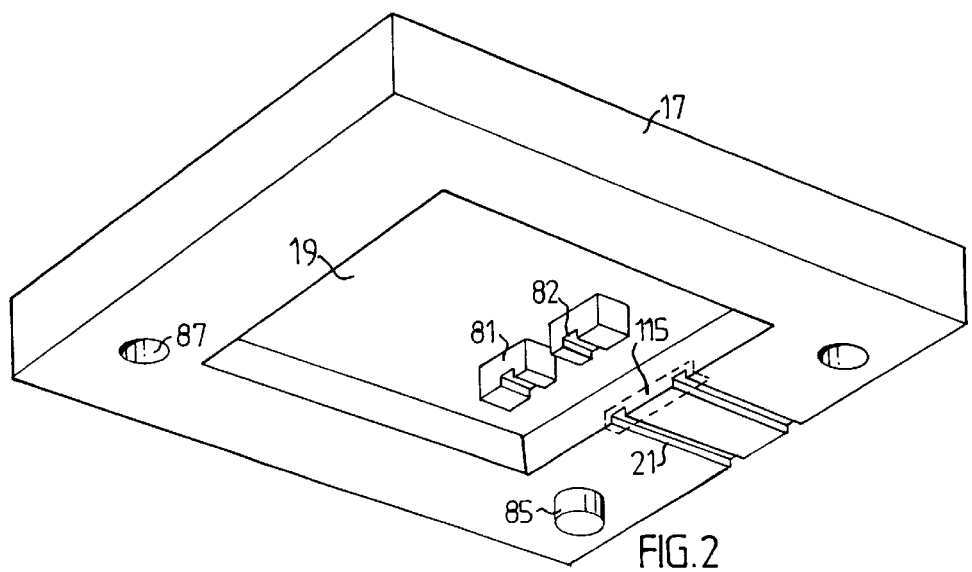
FIG. 2 is a perspective view of an upper mould intended to be used together with the mould of FIG. 1.

The upper mould half 17, see the perspective view of FIG. 2, is also configured as a rectangular block having side surfaces and a top surface, a rectangular mould cavity 19 being formed in a bottom surface and having side surfaces and bottom surfaces parallel to and perpendicular to the exterior surfaces and edges of the upper mould half 17. Grooves 21 for the guide legs 7 are provided on the lower marginal surface surrounding the mould cavity 19, and extend from one side surface of the upper mould half 17 in to the mould cavity 19. In this upper mould cavity there are also protruding supports 81 having support grooves 82, which in the same manner as in the lower mould half constitute an extension of the guide grooves 21 in the marginal area of the very mould half. The upper protruding supports 81 are arranged, so that they, when the two mould halves 1 and 17 are placed on top of each other, are placed exactly above the supports 77 of the lower mould half 1, and the two support parts 77 and 81 further suitably have a similar and rectangular cross section, as seen perpendicularly to the large surfaces of the mould halves.

Figure 7A:
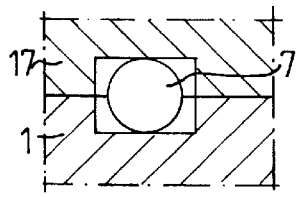
Figure 7B:
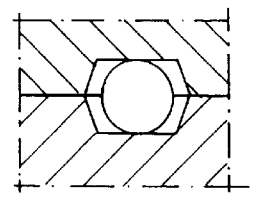
Figure 7C:
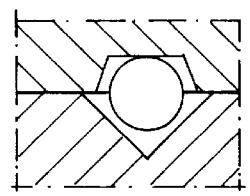
Figure 4:
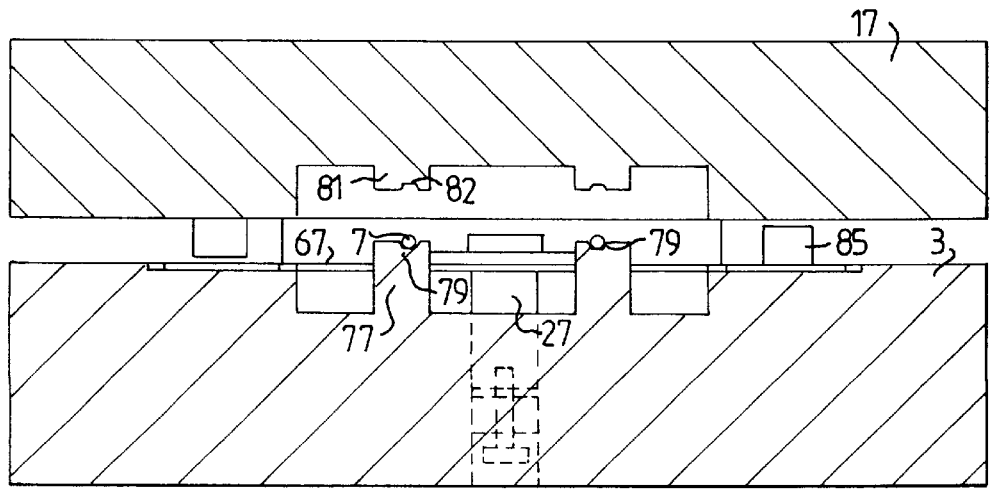
FIG. 4 is a sectional view of the lower and the upper moulds of FIGS. 1 and 2, placed above each other.

Different shapes of the support grooves 13, 17 and 21, 82 respectively of the lower and upper mould half 1 and 17 respectively appear from the cross sectional views in FIGS. 7a–7c, which show partial sections extending perpendicularly to the longitudinal direction of the grooves, when the mould halves have been applied to each other for moulding the encapsulating material. The grooves can have a rectangular cross section as shown in FIG. 7a. Alternatively, the cross section can be a symmetric trapezius, the sloping sides of which diverge only a little from a perpendicular position according to FIG. 7b. It can be advantageous to always have the grooves of the upper mould 17 shaped with a flat bottom portion as in FIGS. 7a and 7b, so that the guide pins 7 can move a little laterally in order to allow an accurate positioning in relation to a component plate having V-grooves placed in the room, since the guide pins 7 for moulding are pressed in a direction towards the upper mould half. The flat bottom portions should then be placed approximately perpendicularly to this compression direction.

For the grooves of the lower mould half, it can, however, be sufficient to design the grooves to have a V-shaped cross section, see FIG. 7c. Such V-grooves can have fairly flatly positioned side surfaces, so that the centre angle of the cross section of the grooves considerably exceeds 50–60°, which is the normal value for other V-grooves, which are used for the accurate positioning of cylindrical bodies, e.g. positioning grooves for a component plate or carrier, see below. The grooves can not in any case be so large, that encapsulating material will be able to penetrate through the narrow slits next to the guide pins during the moulding. These slits can for instance maximally be allowed to have a largest width of about 20 µm for commonly used encapsulating materials. The total depth of the grooves of the lower mould half can somewhat exceed the radius of the cylindrical portion of the guide pins 7, and the grooves of the upper mould half can have a depth essentially corresponding to this radius. In any case the total depth shall, when the grooves of the top and bottom half are placed above and close to each other, somewhat exceed the diameter of the cylindrical portion of the guide pins 7.

Through the configuration and the positioning of the supports 77 and 81 for the guide pins 7, essentially through-holes 109 will be formed during the embedment of the component plate 5, which pass from one side of the encapsulated component to the other one. These through-holes 109 then also have a rectangular cross section, see the schematic perspective view of an encapsulated optocomponent in FIG. 6. The mould cavity 19 of the upper mould half 17 has a contour, which essentially follows the contours of the side surfaces of the shoulders 71 extending perpendicularly from the bottom surface of lower mould cavity 31, see FIG. 1, and the side surface of the lower mould cavity 3, next to which the optical component plate 5 is placed during the moulding operation and where also the flag 53 of the leadframe 51 is placed, when this is correctly placed in the mould.

Positioning pins 85 and corresponding holes 87 are arranged on the top surface of the lower mould half 1 and on the bottom surface of the upper mould half 17. These positioning pins place the two mould halves 1, 17 in a mutually correct position during the moulding process.

An inlet channel 89 is arranged as a groove in the lower mould half 1 and extends from that side surface of the mould cavity 3 of this mould half, which is opposite to the side surface, where the guide pins 7 enter. The channel 89 connects to a channel 91 having somewhat larger cross section dimensions, which extends in parallel to said side surface of the mould cavity 3 up to an outer side surface of the lower mould half 1.

Ejector pins, not shown, can enter through holes shown at 93 through the lower mould half 1 up to the bottom therein in order to release, after a completed encapsulating moulding operation, the whole capsule from the lower mould half 1. Also holes 95 through the lower mould half, which end on the shoulders 71, where the outer contact legs of the leadframe rest in the mould cavity 1, are intended for ejectors, not shown.

In manufacturing an encapsulated optocomponent by means of the moulding tools shown in FIGS. 1–4, the optocomponent plate is hence first placed on the flag 53 of the leadframe 51 by means of a suitable heat conducting adhesive, e.g. some epoxy resin containing a metal filler such as silver balls or the like. On the optocomponent plate 5, waveguide elements 94, see FIG. 3, can extend from one edge of the plate, in the preferred case from the front edge, which when the optoplate 5 is correctly placed in the lower mould cavity 3, is placed quite next to the side surface of this mould cavity 3, where the grooves 13 for the guide pins 7 end. The waveguides 94 connect to the very optocomponent, shown at 96, which can be an active optical component in the form of a monolithic unit. The active component unit 96 is by means of connecting wires, not shown, connected to electrical conductive paths 97 on the component plate 5. These conductive paths 97 are then connected at their other end to the ends of the contact fingers 55 of the leadframe 51 by means of some suitable method, e.g. by soldered or better by friction welding bonded connection wires, not shown.

The leadframe 51 having a component plate 5 attached thereto, which is also electrically connected thereto, is then placed in the lower mould half 1, so that the component plate 5 is placed at that side surface in the mould cavity 3, where the grooves 13 for the guide pins 7 enter. Further, the inner bridge parts 59, the outer bridge parts 61 and the contact pins 57 extending between these, the cross bars 65 and 69, and finally also the wider bridge part 63 rest on the shoulder 71 of the lower mould part 1. Then, the positioning pins 73 are inserted in the corresponding holes 75 of the leadframe in order to keep it in a correct position. The leadframe 51 in the shape of a thin metal foil is then placed having its top surface located essentially in the same plane as the top surface of the lower mould half 1.

The guide grooves 9 on the component plate 5 are now essentially aligned with the support grooves 13 and 79 on the lower mould half or advantageously somewhat upwards displaced from this position. Hereupon the guide pins 7 are inserted into the corresponding guide grooves 9 on the component plate 5, by means of a suitable lateral movement of their support plate into contact with the outer side of the lower mould half 1. When the support plate 11 has been moved forward, the guide pins 7 then will rest in the guide grooves 9 of the component plate 5 and will also be placed in the support grooves 79 of the lower projecting supports 77. If the guide grooves 9 are displaced somewhat upwards in relation to the guide grooves, the component plate 5 will be elastically pressed downwards, due to the guide pins 7. Thereafter the upper mould half 17 is attached, so that the guide pins 85 enter the corresponding guide holes in the other mould half 17. The support grooves 21, 82 of the upper mould half then fit over the guide pins 7, so that these penetrate into the support grooves, and further these grooves press down the guide pins, so that these obtain an accurate vertical position, as seen in the figures, through contact with the bottom surface of the upper support grooves. The movement of the guide grooves 9 and hereby of the component plate 5 is made possible by the resilient suspension of the flag 53 by means of the zigzag shaped, narrow bridge parts 67, by means of which the flag 53 is connected to the other parts of the leadframe 51. If these bridge parts are constructed from a suitable material and of a suitable material thickness, they can also resiliently tend to return the flag to a position in the level of the other part of the leadframe 51. This resilient force results in that the optocomponent plate 5 obtains an accurately determined position in relation to the guide pins, due to the interaction of the guide grooves 9 with the guide pins 7.

However, the resilient force obtained from the bridge parts 67 can in some cases be insufficient for the guide grooves of the optocomponent plate 5 to be kept well pressed against the guide pins 7, in particular when the injection of an encapsulation material requires a high pressure and/or this material has a high viscosity. In order to obtain then stronger bias, there is a plunger 27, see in particular FIG. 4, which initially is set with its free upper surface at an adjusted height and comes into contact with the bottom side of the 53 at the placing of the leadframe 51 in the lower mould half, so that the bottom side of the flag 53 is located in essentially the same plane as the bottom side of the other parts of the leadframe 51 or so that the flag together with the optical component plate 5 is pressed upwards a small distance from this position. Thereupon, the guide pins 7 are, as above, inserted into the guide grooves 9 on the component plate 5 by a lateral movement of their support plate 11. When the support plate 11 has been moved forward, the guide pins 7 rest in the guide grooves 9 of the component plate 5 and also in the support grooves 79 of the lower, upwards projecting supports 77. Thereupon, the upper mould half 17 is, as above, put in its position for moulding. The guide pins 7 are then still located in the guide grooves 9 of the plate 5 and they are finally positioned and even better retained therein, by the fact that the plunger 27 is released, so that it becomes free to act upwards against the flag 53 and press it, together with the component plate 5, strongly upwards to the guide pins.

The component plate 5 together with the leadframe 51 is now completely enclosed in a mould cavity formed by the two mould cavities 3 and 19. If a plunger 27 is arranged, it presses the flag 53 of the leadframe 51 upwards and thereby also the component plate 5, so that the guide pins 7 become inserted and very accurately positioned in the guide grooves 9. The guide pins 7 will then, with portions just outside the locations, where their connection to the guide grooves 9 of the component plate 5 end, be in engagement with the bottom surface of the upper support grooves 21 and 82. The necessary lateral and elevational movement of the optocomponent plate 5 for positioning its guide grooves 9 against the guide pins 7 is, as has already been pointed out, made possible by the zigzag shaped narrow bridge parts 67, by means of which the flag 53 is connected to the other parts of the leadframe 51, and which provides a restoring pressing force and contributes in the accurate relative positioning. Connecting wires between the optocomponent plate 5 and the contact fingers 55 of the leadframe 51 could be obstructive for movement of the component plate, but these connection wires must be thin and flexible enough to allow the exact relative positioning of the component plate 5 with its guide grooves 9 well receiving the guide pins 7.

The two mould halves 1 and 17 are clamped together with a required compression force in order not to be separated during the following injection of a plastics material. Further, the support plate 11 for the guide pins 7 is clamped hard to the side surfaces of the mould halves. Thereupon, a suitable plastics material is injected through the inlet channel formed by the grooves 91, 89 together with the bottom side surface of the upper mould half 17. The injected plastics material is made to solidify, e.g. is made to harden a suitable time, in the case where the injected plastics material is of thermosetting type.

After this, the mould halves 1 and 17 are separated, suitable ejectors are introduced through the holes 93, 95 and the encapsulated component is thereby released from the mould halves and in particular from the lower mould half 1. Before this, the guide pins 7 have been extracted from the mould cavity 3, 19 by removal of its support plate 11 array from the mould halves 1 and 17.

Thereafter, the encapsulated component can be released from non-desired parts of the leadframe 51. This is performed by cutting off the inner and outer bridge parts 59 and 61 respectively on both sides of the contact legs 57 and also on both sides of the special cross bars 69 at the edge of the optocomponent. When these parts of the inner and outer bridges 59 and 61 have been removed, only the connection legs 57 hence protrude from the sides of the capsule, of which only one, such as the one shown at 99, need to have a supporting function. Also the front support pins 69 project from the capsule. These supporting legs 99 and 69 respectively remain secured to the capsule, by the fact that they have portions 101, see FIGS. 3 and 5, which extend inside the inner bridge part 59, and by the fact that these portions are equipped with anchoring holes 103, in which plastics material can be applied during the encapsulation.

Figure 6:
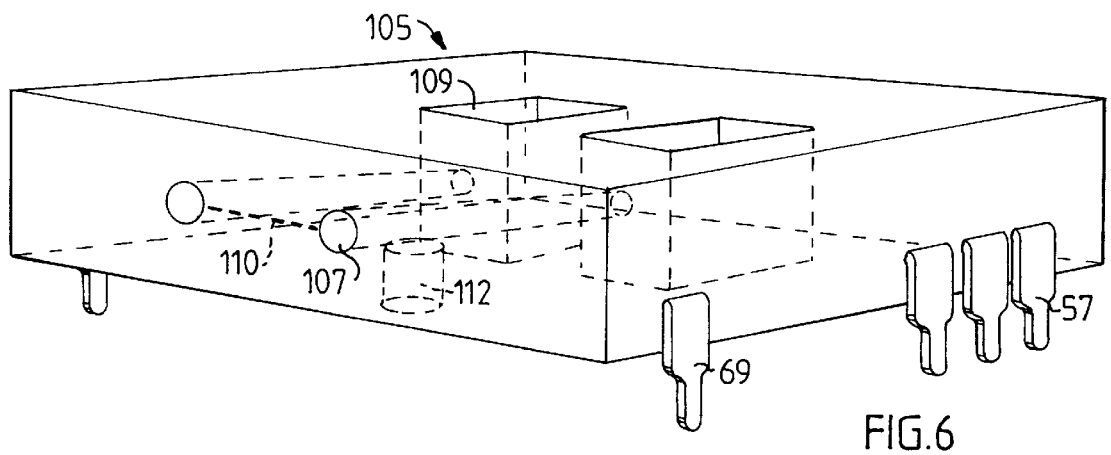
FIG. 6 is a perspective view of an optocapsule manufactured by means of the moulds of FIGS. 1 and 2, FIGS. 7a–7c are partial sectional views illustrating the profile of support grooves for support pins.

Moulding residues can be left in the holes 109, see FIG. 6, from the supports 77 and 81 for the guide pins 7 and these residues are removed in a suitable manner. Moulding residues in the holes 107 from the guide pins 7 can then easily by pressed out through the first mentioned holes 109. The front edge of the optocapsule, where the holes 107 corresponding to the guide pins 7 end and also where the ends of the waveguides 93 are placed, are then polished, so that these ends of the waveguides are exposed in order to be capable of connection with a correspondingly designed optical component unit or an optical connector device having holes for guide pins and having outer optical connector surfaces placed between the mouths of the holes. Further, the plunger 27 leaves a cylindric hole 112 in the under side of the encapsulated component, which hole extends up to the bottom side of the flag 53 of the leadframe 51 or in the case the flag itself has a hole, up to the bottom side of the embedded component plate 5 itself. This hole 112 can be used for, for instance thermal dissipation from the component plate.

The encapsulated optocomponent 105 then has the general shape as shown in a perspective view in FIG. 6, the capsule 105 having the shape of a rectangular block or a rectangular plate having large top and bottom surfaces. Holes 107 for the guide pins extend from a front side of the capsule 105 up to rectangular through-holes 109. These holes extend from one of the large surfaces of the capsule 105 to its other large surface, perpendicularly to them. Between the mouths of the holes 107 in the side surface of the capsule 105, end surfaces 110 of the waveguides 93 accessible from the outside are located, for coupling optical signals to another encapsulated component or another optical connector device having connections of the same shape.

What is claimed is:

1. A leadframe of an electrically conductive material for connection of electric terminals of an optocomponent and having substantially rectangular outer edges, the leadframe comprising:

a flag for attachment to a main part of the optocomponent;

connection fingers having ends for electrical connection to the electric terminals on the optocomponent;

support parts extending between the connection fingers and connected to the connection fingers at areas located at a distance from the ends of the connection fingers;

support bridges connecting the flag to the support parts, the support bridges being connected to the support parts; and ends of the support parts and the flag being located at the same one of the outer edges of the leadframe.

2. The leadframe of claim 1, wherein the flag is centrally located at said one of the outer edges of the leadframe.

3. The leadframe of claim 1, wherein the flag has edges, a first edge of which forms a portion of said one of the outer edge of the leadframe.

4. The lead frame of claim 3, wherein the ends of the connection fingers for electrical connection to the electrical terminals on the component are located next to an edge of the flag, which is opposite to the first edge.

5. The lead frame of claim 1, wherein the ends of the connection fingers for electrical connection to the components are located next to a substantially rectilinear edge of the flag.

6. The leadframe of claim 5, wherein the support parts extend substantially perpendicularly to said substantially rectilinear edge of the flag.

7. The leadframe of claim 1, wherein each of the support bridges has a shape of a band located in one plane, the band being bent alternatingly to one side and then another side, as seen in a movement from a connection area of the bridge at a support part to a connection area at the flag.

8. The leadframe of claim 1, wherein each of the support bridges has a shape of a zigzag band located in one plane.

9. A leadframe of an electrically conductive material for connection of electrical terminals on an optocomponent and having substantially rectangular outer edges, the leadframe comprising:

a flag for attachment to a main part of the optocomponent;

connection fingers having ends for electrical connection to the electrical terminals on the optocomponent;

support parts extending between the connection fingers and connected to the connection fingers at areas located at a distance from the ends of the connection fingers;

support bridges connecting the flag to the support parts; and the flag being located at one of the outer edges of the leadframe and having rectilinear edges, the ends of all of the connection fingers for electrical connection to the electrical terminals on the component being located next to a first one of the edges of the flag.

10. The leadframe of claim 9, wherein a second one of the edges of the flag forms a portion of said one of the outer edges of the leadframe.

11. The leadframe of claim 10, wherein the first and second edges of the flag are opposite to each other.

12. The leadframe of claim 9, wherein the support parts extend substantially perpendicularly to the first edge of the flag.

13. The leadframe of claim 9, wherein each of the support bridges has a shape of a band located in one plane, the band being bent alternatingly to one side and then another side, as seen in a movement from a connection area of the bridge at a support part to a connection area at the flag.

14. The leadframe of claim 9, wherein each of the support bridges has a shape of a zigzag band located in one plane.

15. The leadframe of claim 13, wherein the support bridges allow the flag to move to adapt the optocomponent to positioning pins.

16. The leadframe of claim 14, wherein the support bridges allow the flag to move to adapt the optocomponent to positioning pins.

17. A leadframe of an electrically conductive material for connection of electrical terminals on an optocomponent and having substantially rectangular outer edges, the leadframe comprising:

a flag for attachment to a main part of the optocomponent;

connection fingers having ends for electrical connection to the electrical terminals on the optocomponent;

support parts extending between the connection fingers and connected to the connection fingers at areas located at a distance from the ends of the connection fingers;

support bridges connecting the flag to the support parts; and;

the flag being located at one of the outer edges of the leadframe and the support parts extending substantially perpendicular to said one of the outer edges of the leadframe.

18. The leadframe of claim 17, wherein each of the support bridges has a shape of a band located in one plane, the band being bent alternatingly to one side and then another side, as seen in a movement from a connection area of the bridge at a support part to a connection area at the flag.

19. The leadframe of claim 17, wherein each of the support bridges has a shape of a zigzag band located in one plane.

20. A leadframe of an electrically conductive material for connection of electrical terminals on an optocomponent and having substantially rectangular outer edges, the leadframe comprising:

a flag for attachment to a main part of the optocomponent;

connection fingers having ends for electrical connection to the electrical terminals on the optocomponent;

support parts extending between the connection fingers and connected to the connection fingers at areas located at a distance from the ends of the connection fingers;

support bridges connecting the flag to the support parts; and the flag being located at one of the outer edges of the leadframe and each of the support bridges having a shape of a band located in one plane, the band being bent alternatingly to one side and then another side, as seen in a movement from a connection area of the bridge at a support part to a connection area at the flag, to allow the flag to move to adapt the optocomponent to positioning pins.

21. A leadframe of an electrically conductive material for connection of electrical terminals on an optocomponent and having substantially rectangular outer edge, the leadframe comprising:

a flag for attachment to a main part of the optocomponent;

connection fingers having ends for electrical connection to the electrical terminals on the optocomponent;

support parts extending between the connection fingers and connected to the connection fingers at areas located at a distance from the ends of the connection fingers;

support bridges connecting the flag to the support parts; and the flag being located at one of the outer edges of the leadframe and each of the support bridges having a shape of a zigzag band located in one plane to allow the flag to move to adapt the optocomponent to positioning pins.

* * * * *